(12) United States Patent
Benoit et al.

(10) Patent No.: US 8,765,575 B2
(45) Date of Patent: Jul. 1, 2014

(54) SHALLOW TRENCH FORMING METHOD

(71) Applicant: STMicroelectronics International N.V., Crolles (FR)

(72) Inventors: Daniel Benoit, Saint-Ismier (FR); Laurent Favennec, Villard Bonnot (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 13/855,139

(22) Filed: Apr. 2, 2013

(65) Prior Publication Data

US 2013/0288450 A1    Oct. 31, 2013

(30) Foreign Application Priority Data

Apr. 26, 2012 (FR) ...................................... 12 53852

(51) Int. Cl.
*H01L 21/76* (2006.01)
*H01L 21/762* (2006.01)

(52) U.S. Cl.
CPC .... *H01L 21/76224* (2013.01); *H01L 21/76283* (2013.01)
USPC .......................................... 438/426; 438/401

(58) Field of Classification Search
CPC ................................................. H01L 21/76224
USPC ......... 438/426, 401, 243, 259, 270, 386, 387, 438/388, 389, 391
See application file for complete search history.

(56) References Cited

U.S. PATENT DOCUMENTS

| | | | |
|---|---|---|---|
| 4,810,668 A * | 3/1989 | Ito | 438/432 |
| 5,926,717 A * | 7/1999 | Michael et al. | 438/387 |
| 6,214,691 B1 * | 4/2001 | Yong et al. | 438/400 |
| 6,326,268 B1 * | 12/2001 | Park et al. | 438/262 |
| 6,613,649 B2 * | 9/2003 | Lim et al. | 438/435 |
| 7,262,090 B2 * | 8/2007 | Tu | 438/243 |
| 8,324,074 B2 * | 12/2012 | Cheng et al. | 438/424 |
| 2005/0242403 A1 * | 11/2005 | Yeap et al. | 257/374 |
| 2008/0157260 A1 | 7/2008 | Fried | |
| 2008/0274595 A1 | 11/2008 | Spencer | |
| 2009/0184356 A1 | 7/2009 | Brodsky | |
| 2011/0127634 A1 * | 6/2011 | Eun | 257/510 |

FOREIGN PATENT DOCUMENTS

EP    2390907 A1    11/2011

* cited by examiner

*Primary Examiner* — Jarrett Stark
*Assistant Examiner* — Mohammad M Hoque
(74) *Attorney, Agent, or Firm* — The Noblitt Group, PLLC

(57) ABSTRACT

A method for forming a trench filled with an insulator crossing a single-crystal silicon layer and a first $SiO_2$ layer and penetrating into a silicon support, this method including the steps of forming on the silicon layer a second $SiO_2$ layer and a first silicon nitride layer, forming the trench, and performing a first oxidizing processing to form a third $SiO_2$ layer; performing a second oxidizing processing to form, on the exposed surfaces of the first silicon nitride layer a fourth $SiO_2$ layer; depositing a second silicon nitride layer and filling the trench with $SiO_2$; and removing the upper portion of the structure until the upper surface of the silicon layer is exposed.

8 Claims, 3 Drawing Sheets

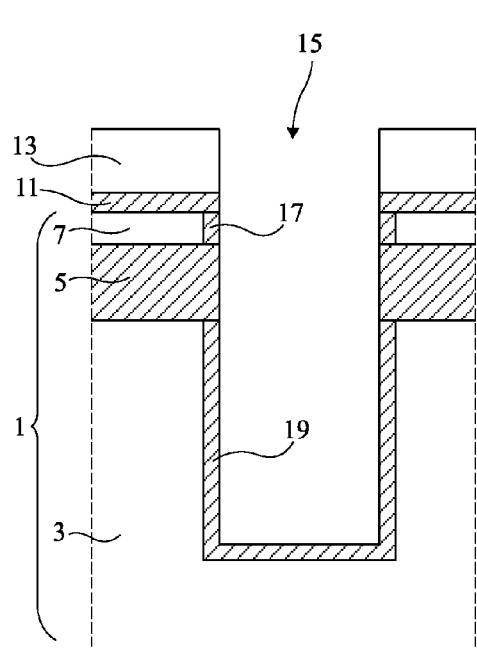
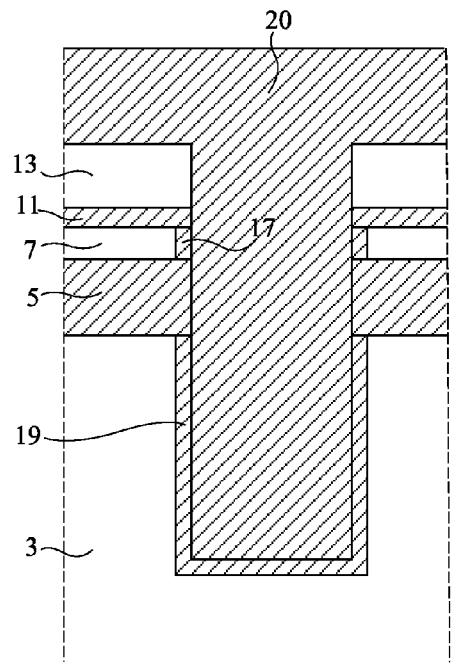
Fig 1A    Fig 1B
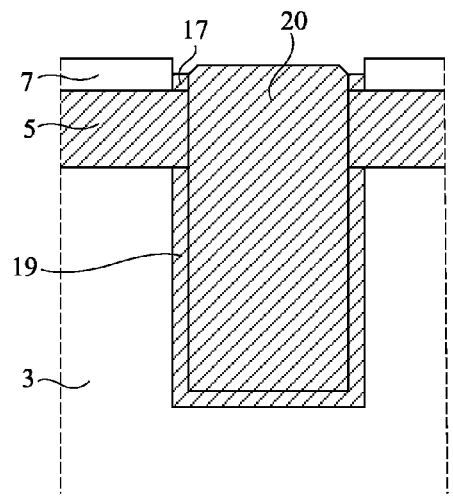
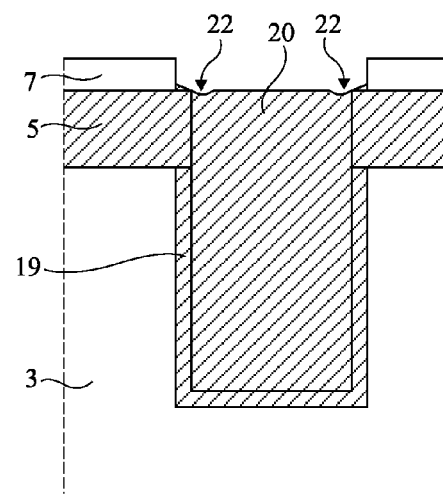
Fig 1C    Fig 1D

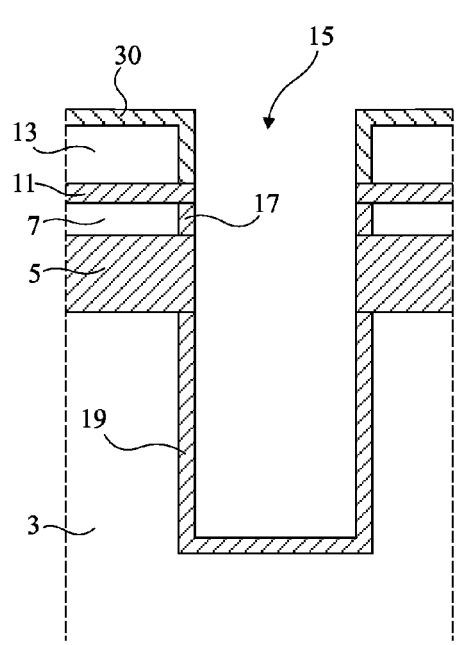
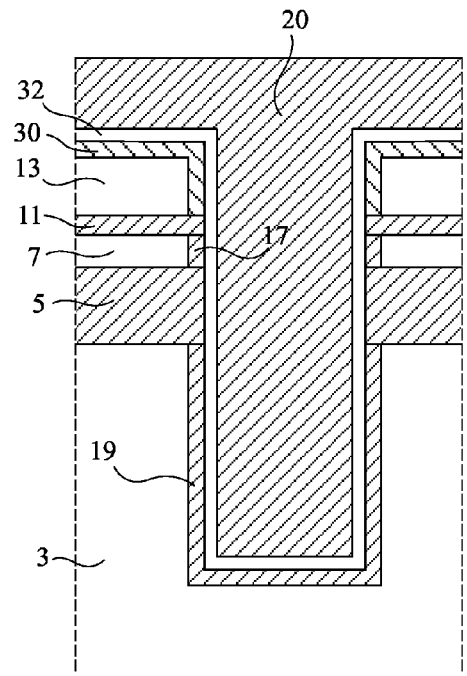
Fig 2A
Fig 2B
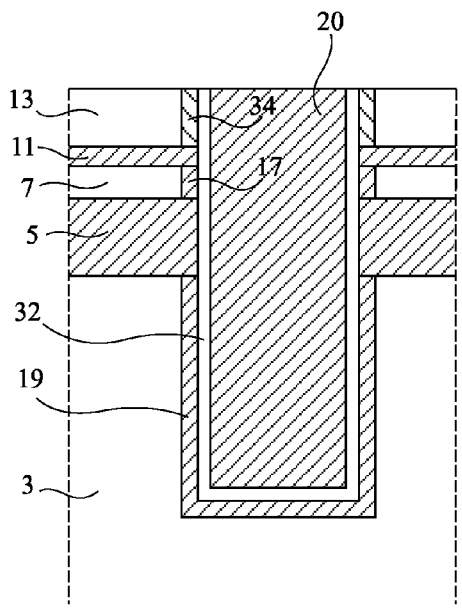
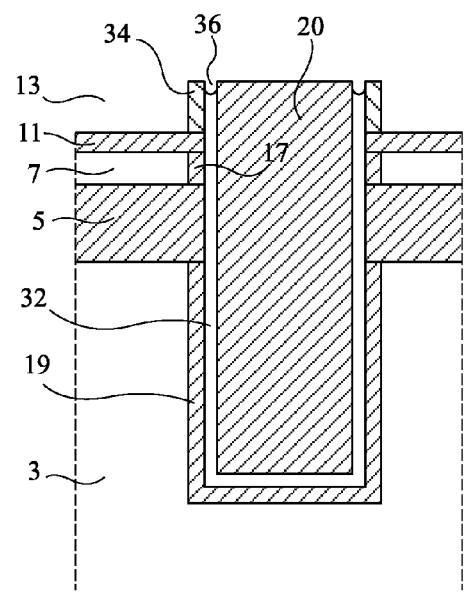
Fig 2C
Fig 2D

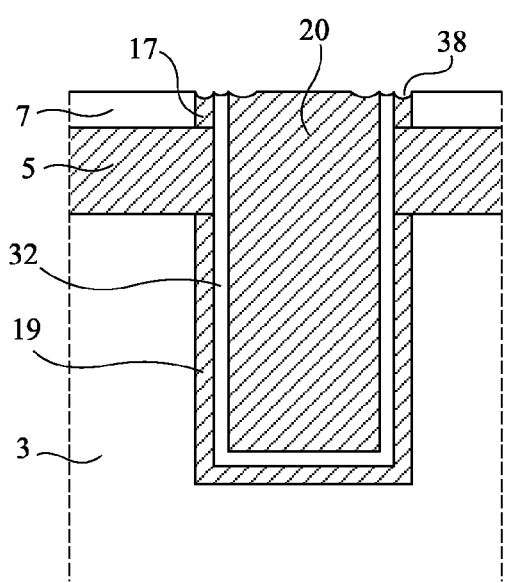 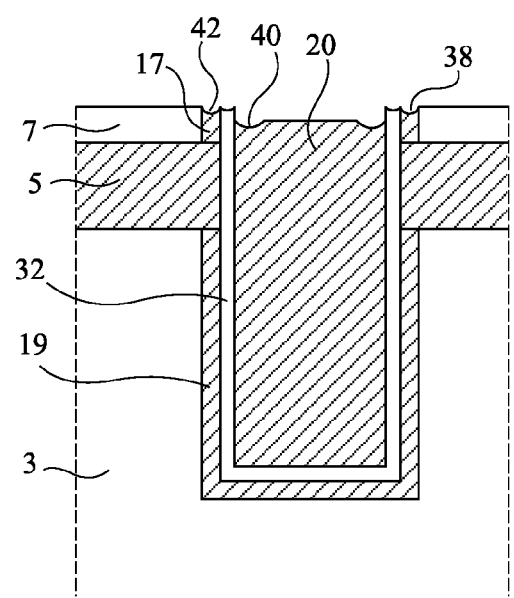
Fig 2E                    Fig 2F

SHALLOW TRENCH FORMING METHOD

CROSS REFERENCE TO RELATED APPLICATION

This application is a translation of and claims the priority benefit of French patent application number 12/53852 filed on Apr. 26, 2012, entitled "SHALLOW TRENCH FORMING METHOD", which is hereby incorporated by reference to the maximum extent allowable by law.

BACKGROUND

1. Technical Field

The present disclosure relates to the forming of Shallow Trench Insulation (STI), to separate electronic components formed on a silicon-on-insulator or SOI type wafer. The present disclosure more specifically aims at the forming of trenches in structures where the thin single-crystal silicon structure formed on an insulator has a very small thickness, for example, approximately in the range of 5 to 25 nm, and the insulating layer on which this thin single-crystal silicon layer lies also has a small thickness, approximately in the range of 10 to 50 nm.

2. Discussion of the Art

FIG. 1A shows an SOI wafer comprising a single crystal silicon support 3 coated with an insulating silicon oxide layer 5 ($SiO_2$) coated with a thin single-crystal silicon layer 7. This wafer is coated with a hard mask comprising a thin $SiO_2$ layer 11 coated with a silicon nitride layer ($Si_3N_4$) 13. After a masking step, a trench 15 has been formed by anisotropic etch methods, generally comprising plasma etchings adapted to the various materials to be etched. Trench 15 crosses masking layers 11 and 13, single-crystal silicon layer 7, and insulator layer 5, and penetrates into silicon support 3. As an example, the case where the trench has a width approximately in the range of 40 to 100 nm and a depth approximately in the range of 100 to 300 nm, where oxide layer 5 has a thickness approximately in the range of 10 to 50 nm, for example, 30 nm, and where thin single-crystal silicon layer 7 has a thickness approximately in the range of 5 to 25 nm, for example, 10 nm, is considered herein. After the trench has been formed, a thermal oxidation step is carried out, whereby an $SiO_2$ cladding 17 forms on the exposed surface of single-crystal silicon layer 7 and an $SiO_2$ cladding 19 forms on the exposed surface of silicon support 3.

As illustrated in FIG. 1B, silicon oxide is then deposited by low-temperature chemical deposition so that this oxide 20 fills trench 15. Silicon oxide of a given thickness is thus inevitably present above the wafer.

After this, as illustrated in FIG. 1C, all that has been formed or deposited on the wafer above thin silicon layer 7 is removed. This removal may for example first be performed by chem.-mech. polishing of the upper portion of silicon oxide 20 and of silicon nitride 13. This etching stops when silicon oxide layer 11 has been reached. After this, silicon oxide 11 is selectively etched to obtain a topography of the type illustrated in FIG. 1C where the upper surface of silicon oxide 20 filling trench 1 is slightly below the upper level of single-crystal silicon layer 7, while there only remains a lower portion of thermal $SiO_2$ cladding 17. Further, currently, the exposed surface of filling silicon oxide 20 is lower at the interface with silicon 7 than in the middle of the trench.

It should be noted that the etching operations must be performed with special care, given the very small thickness (on the order of 10 nm) of layer 7, which means that the etching of oxide 20 must be performed with a precision to within from 1 to 2 nm to avoid for the oxide filling the trench to lower below the silicon level.

Despite all these precautions, as illustrated in FIG. 1D, the upper level of oxide filling 20 tends to lower in subsequent wafer processing. Indeed, during such subsequent processing, there inevitably are oxide layer etching phases and the etching process also acts on oxide 20 and especially on its edges where craters 22 (actually, a ring) tend to form. This lowering of oxide 20 may cause a deterioration of the components subsequently formed in thin silicon layer 7 if this causes a decrease in the thickness of insulating layer 5.

There thus is a need to improve the filling of shallow trenches with insulator, essentially in the context of SOI-type technologies where a very thin silicon layer (having a thickness approximately in the range of 5 to 25 nm) is formed on a thin insulating layer (having a thickness approximately in the range of 10 to 50 nm).

BRIEF SUMMARY

Thus, an embodiment provides a method for forming a trench filled with an insulator in a wafer comprising a silicon support coated with a first silicon oxide layer and with a single-crystal silicon layer, the trench crossing the silicon and silicon oxide layers and penetrating into the support, this method comprising the steps of:

forming on the silicon layer a second silicon oxide layer and a first silicon nitride layer, masking and etching to form the trench, and performing a first oxidizing processing to form a third silicon oxide layer on the exposed silicon surface;

performing a second oxidizing processing in the presence of an oxygen plasma to form, on the exposed surfaces of the first silicon nitride layer, a fourth silicon oxide layer;

depositing a second silicon nitride layer and filling the trench with silicon oxide; and removing the upper portion of the structure until the upper surface of the silicon layer is exposed.

According to an embodiment, the step of removal of the upper portion of the structure comprises the steps of:

removing by chem.-mech. etching the portions of layers formed above the first silicon nitride layer;

removing by selective wet etching the first silicon nitride layer; and removing by selective wet etching or by selective plasma etching the second silicon oxide layer and an upper portion of the silicon oxide filling the trench.

According to an embodiment, the single-crystal silicon layer has a thickness in the range of 5 to 25 nm, for example, 10 nm.

According to an embodiment, the first silicon oxide layer has a thickness in the range of 5 to 50 nm, for example, 30 nm.

According to an embodiment, the fourth silicon oxide layer 1 has a thickness in the range of 1 to 5 nm, for example, 3 nm.

According to an embodiment, the trench has a depth in the range of 100 to 300 nm and a width in the range of 40 to 100 nm.

According to an embodiment, the silicon oxide layers are stoichiometric silicon oxide layers.

According to an embodiment, the silicon nitride layers are stoichiometric silicon nitride layers.

The foregoing and other features and advantages will be discussed in detail in the following non-limiting description of specific embodiments in connection with the accompanying drawings.

BRIEF DESCRIPTION OF THE DRAWINGS

FIGS. 1A to 1D are cross-section views illustrating shallow insulation trench filling steps; and FIGS. 2A to 2F are cross-section views illustrating an embodiment of a succession of shallow insulation trench filling steps.

As usual in the representation of integrated circuits, the various drawings are not to scale.

DETAILED DESCRIPTION

An embodiment of a shallow insulation trench filling process overcoming the disadvantages of the method described in relation with FIGS. 1A to 1D will now be described in relation with FIGS. 2A to 2F. In these drawings, the same elements as those described in relation with FIGS. 1A to 1D are designated with the same reference numerals and will not be described in detail again.

FIG. 2A shows the device at a step immediately following the step described in relation with FIG. 1A. In addition to the elements shown in relation with FIG. 1A, one can note a silicon oxide layer 30 formed on the apparent surfaces of upper silicon nitride layer 13. This silicon oxide layer may be formed by transformation of the $Si_3N_4$ into a low-temperature plasma.

This plasma may be of radio frequency, low frequency, continuous, or microwave origin, the plasma reactor atmosphere may contain oxidizing gases such as $CO_2$, $O_3$, $O_2$, or $N_2O$, and the processing temperature may range between 80 and 500° C.

At the step illustrated in FIG. 2B, a silicon nitride layer 32 having a thickness of a few nm, for example, approximately in the range of 1 to 10 nm, has been deposited over the entire structure. Layer 32 coats the upper surface of oxide 30, as well as the walls and the bottom of trench 15. Finally, as in the case of FIG. 1B, the trench has been filled with silicon oxide 20.

At the step illustrated in FIG. 2C, the upper surface of the structure has been removed by chem.-mech. polishing to reach silicon nitride layer 13. The upper surface of the structure is then leveled. It should be noted that the vertical portion 34 of silicon oxide layer 30 remains in place.

At the step illustrated in FIG. 2D, the silicon nitride has been etched by wet etching. Thus, the entire silicon nitride layer 13 is removed. Silicon oxide layers 11 and 34 are then exposed. However, the upper portion of cladding layer 32, also made of silicon nitride, is only removed down to a depth smaller than the height of layer 13 since, in known fashion, when a wet etching is performed, a small area (the apparent ring of layer 32) is removed slower than a larger area (layer 13). Thus, at the step of FIG. 2D, there only is a small recess 36 of silicon nitride cladding 32, this recess being shallower than the initial thickness of layer 13.

At the step illustrated in FIG. 2E, a selective silicon oxide plasma etching by plasma or wet etching has been performed. This step is continued until total removal of layer 11. During this step, the portion of layer 34 which is above layer 11 is also removed, since it has a large lateral surface area exposed to the etching. However, the upper surface of oxide layer portion 17 resulting from the initially performed thermal oxidation 38 substantially remains at the level of the upper surface of single-crystal silicon layer 7.

Thus, at the step of FIG. 2E, one has obtained, at the surface of filling $SiO_2$ 20, very shallow recesses of the central portion which, in all cases, do not extend all the way to silicon oxide insulating layer 5. This insulation thus does not risk being deteriorated.

FIG. 2F illustrates the structure after subsequent manufacturing steps have been carried out. As indicated previously, in subsequent steps, there inevitably are steps of silicon oxide etching which risk altering the structure of FIG. 2E. Given the quality obtained in FIG. 2E, such subsequent steps will at worst contribute, as shown in FIG. 2F, to slightly deepening the upper surface of silicon oxide 20 by forming shallow lateral craters 40. However, the upper surface of cladding layer 17 will be little affected and a negligible lowering 42 of layer 17 will be obtained.

As an example, and using same values as previously, the thicknesses of the different layers and the dimensions of the different structures may for example be the following:

$SiO_2$ layer 5: from 5 to 50 nm, for example, 30 nm,
silicon layer 7: from 5 to 25 nm, for example, 10 nm,
$SiO_2$ layer 11: from 1 to 5 nm, for example, 2 nm,
$Si_3N_4$ layer 13: from 10 to 80 nm, for example, 50 nm,
$SiO_2$ layer 30: from 1 to 5 nm, for example, 3 nm,
$Si_3N_4$ layer 32: from 2 to 5 nm, for example, 3 nm,
depth of trench 15: from 100 to 300 nm, for example, 150 nm,
width of trench 15: from 40 to 100 nm, for example, 80 nm.

The present invention is likely to have various alterations, modifications, and improvements which will readily occur to those skilled in the art, especially regarding the materials of the various layers and materials mentioned herein. For example, oxide 30-34 may or not be stoichiometric, or may be of SiON type. Nitride 32 may or not be stoichiometric. For the other mentioned compound materials, they are preferably stoichiometric.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for forming a trench filled with an insulator in a wafer comprising a silicon support coated with a first silicon oxide layer and with a single-crystal silicon layer, the trench crossing the silicon and silicon oxide layers and penetrating into the support, this method comprising the steps of:
    forming on the silicon layer a second silicon oxide layer and a first silicon nitride layer, masking and etching to form the trench while leaving in place the second oxide layer and the first nitride layer outside of the trench, and performing a first oxidizing processing to form a third silicon oxide layer on the exposed silicon surfaces;
    performing a second oxidizing processing in the presence of an oxygen plasma to form on the exposed surfaces of the first silicon nitride layer a fourth silicon oxide layer;
    depositing a second silicon nitride layer and filling the trench with silicon oxide; and
    removing the upper portion of the structure until the upper surface of the silicon layer is exposed.

2. The method of claim 1, wherein the step of removal of the upper portion of the structure comprises the steps of:
    removing by chem.-mech. etching the portions of layers formed above the first silicon nitride layer;
    removing by selective wet etching the first silicon nitride layer; and
    removing by selective wet etching or by selective plasma etching the second silicon oxide layer and an upper portion of the silicon oxide (20) filling the trench.

3. The method of claim 1, wherein the single-crystal silicon layer has a thickness in the range of 5 to 25 nm, for example, 10 nm.

4. The method of claim 1, wherein the first silicon oxide layer has a thickness in the range of 5 to 50 nm, for example, 30 nm.

5. The method of claim 1, wherein the fourth silicon oxide layer has a thickness in the range of 1 to 5 nm, for example, 3 nm.

6. The method of claim 1, wherein the trench has a depth in the range of 100 to 300 nm and a width in the range of 40 to 100 nm.

7. The method of claim 1, wherein the silicon oxide layers are stoichiometric silicon oxide layers.

8. The method of claim 1, wherein the silicon nitride layers are stoichiometric silicon nitride layers.

* * * * *